(12) United States Patent
Mulders

(10) Patent No.: US 10,884,070 B2
(45) Date of Patent: Jan. 5, 2021

(54) SYSTEM AND METHOD FOR GROUND FAULT DETECTION USING CURRENT MEASUREMENT COILS

(71) Applicant: KONINKLUJKE FABRIEK INVENTUM B.V., Nieuwegein (NL)

(72) Inventor: Dennis Mulders, Etten-Leur (NL)

(73) Assignee: Koninklijke Fabriek Inventum B.V., Nieuwegein (NL)

( * ) Notice: Subject to any disclaimer, the term of this patent is extended or adjusted under 35 U.S.C. 154(b) by 84 days.

(21) Appl. No.: 16/261,755

(22) Filed: Jan. 30, 2019

(65) Prior Publication Data
US 2020/0241064 A1      Jul. 30, 2020

(51) Int. Cl.
*G01R 31/50*     (2020.01)
*G01R 15/18*     (2006.01)
*G01R 19/10*     (2006.01)

(52) U.S. Cl.
CPC .............. *G01R 31/50* (2020.01); *G01R 15/18* (2013.01); *G01R 19/10* (2013.01)

(58) Field of Classification Search
CPC . H01L 21/268; H01L 21/67248; H01L 22/12; B23K 26/354; B23K 26/032; B23K 2103/56; G01N 21/25; G01N 2021/1782; G01N 21/8422; G01N 21/45; G01N 21/55; G01N 2021/8416
See application file for complete search history.

(56) References Cited

U.S. PATENT DOCUMENTS

| 5,206,587 A * | 4/1993 | Rose .................... G01D 5/2006 324/207.16 |
| 2013/0128396 A1* | 5/2013 | Danesh .................. G01R 19/00 361/45 |
| 2019/0079117 A1* | 3/2019 | Hurwitz ............... G01R 15/146 |

* cited by examiner

*Primary Examiner* — Akm Zakaria
(74) *Attorney, Agent, or Firm* — Suiter Swantz pc llo

(57) ABSTRACT

A system for current measurement and ground fault detection is disclosed. In embodiments, the system includes a plurality of phase current measurement coils configured to detect phase currents associated with at least one portion of a multi-phase system. The system further includes a plurality of phase current measurement circuits and a ground fault detection circuit connected to the phase current measurement coils. The phase current measurement circuits are configured to measure the phase currents detected by the phase current measurement coils, and the ground fault detection circuit is configured to measure a summation of the phase currents detected by the phase current measurement coils.

11 Claims, 4 Drawing Sheets

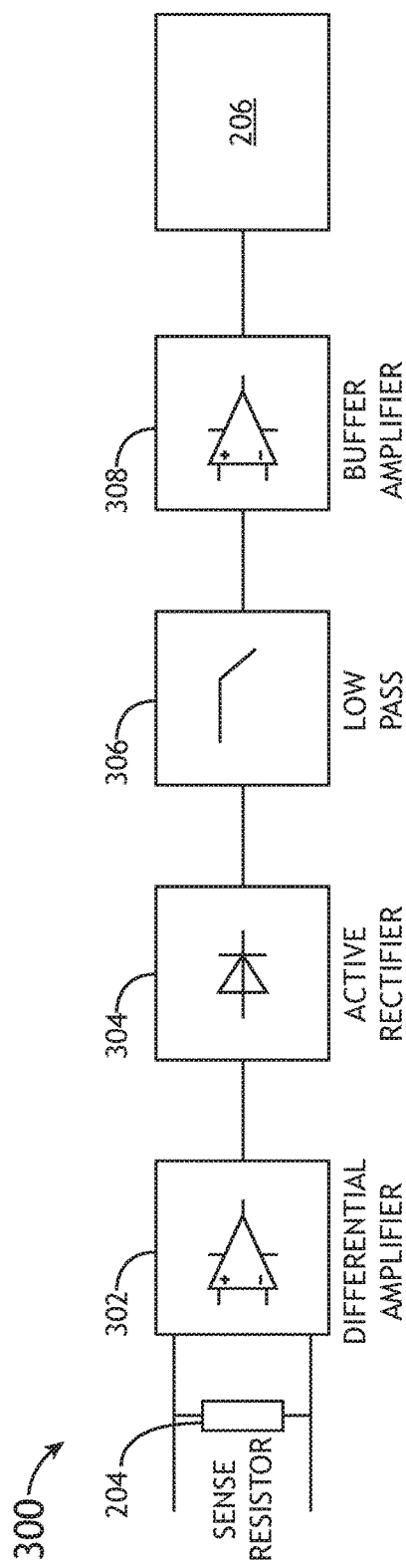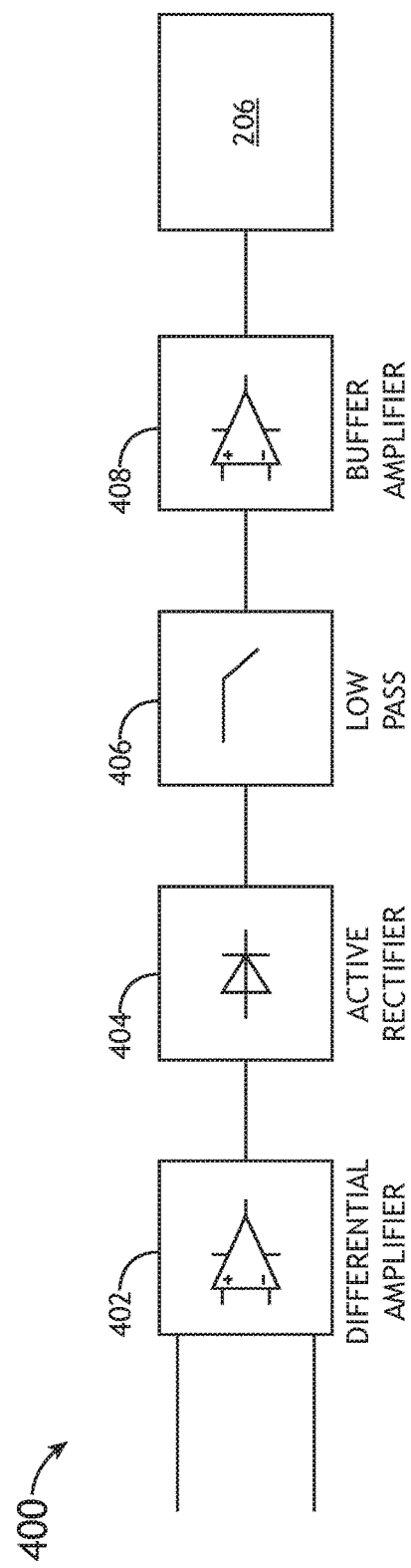

SYSTEM AND METHOD FOR GROUND FAULT DETECTION USING CURRENT MEASUREMENT COILS

BACKGROUND

An oven (or any other device) may employ current measurement coils to measure the currents through respective phases of a multi-phase system that powers one or more components of the oven. These coils effectively implement transformers that divide the current by a fixed factor. The lower current can then be fed through a resistor (optionally with a rectifier in front) and the voltage over the resistor is then an indicator of the current flowing.

Older ovens only make use of a current measurement per power phase. In newer ovens, it may be advantageous to also implement ground fault detection systems/circuitry to detect current leaking, for instance, through chassis.

SUMMARY

In an aspect, embodiments of the inventive concepts disclosed herein are directed to a system for current measurement and ground fault detection. In embodiments, the system includes a plurality of phase current measurement coils configured to detect phase currents associated with at least one portion of a multi-phase system. The system further includes a plurality of phase current measurement circuits and a ground fault detection circuit connected to the phase current measurement coils. The phase current measurement circuits are configured to measure the phase currents detected by the phase current measurement coils, and the ground fault detection circuit is configured to measure a summation of the phase currents detected by the phase current measurement coils.

In another aspect, embodiments of the inventive concepts disclosed herein are directed to a device that includes circuitry for current measurement and ground fault detection. In embodiments, the device includes one or more components that are powered by a multi-phase system. The device further includes a plurality of phase current measurement coils configured to detect phase currents associated with at least one portion of a multi-phase system. The device further includes a plurality of phase current measurement circuits and a ground fault detection circuit connected to the phase current measurement coils. The phase current measurement circuits are configured to measure the phase currents detected by the phase current measurement coils, and the ground fault detection circuit is configured to measure a summation of the phase currents detected by the phase current measurement coils.

In another aspect, implementations of the inventive concepts disclosed herein are directed to a method of current measurement and ground fault detection. In implementations, the method includes steps of: detecting phase currents with a plurality of phase current measurement coils; measuring the phase currents detected by the phase current measurement coils with a plurality of phase current measurement circuits; and measuring a summation of the phase currents detected by the phase current measurement coils with a ground fault detection circuit.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIG. 3 is a schematic illustration of a phase current measurement circuit of the system/circuitry illustrated in FIG. 2, in accordance with example embodiments of this disclosure;

FIG. 4 is a schematic illustration of a ground fault detection circuit of the system/circuitry illustrated in FIG. 2, in accordance with example embodiments of this disclosure.

DETAILED DESCRIPTION

Figure 1:
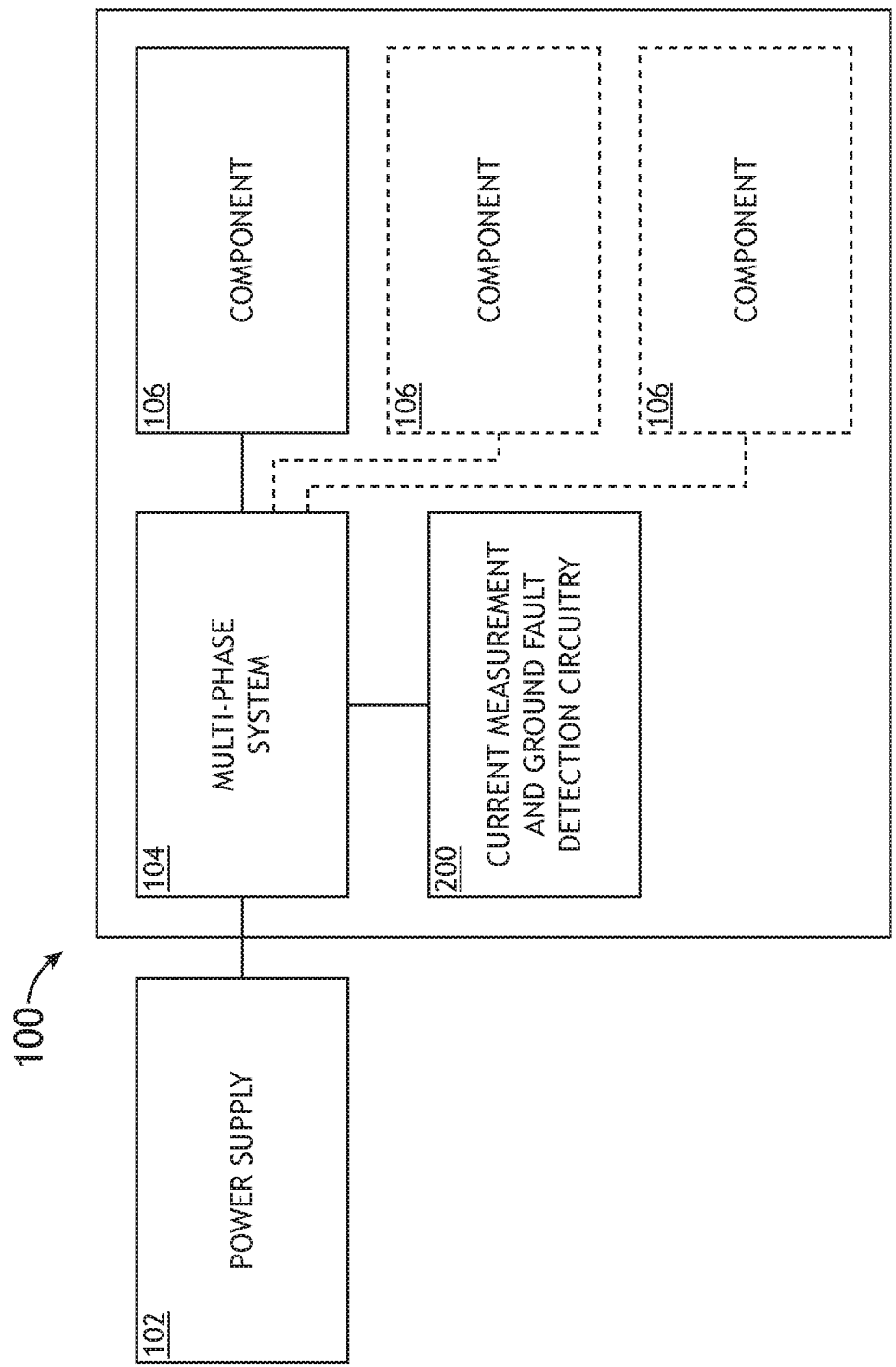
FIG. 1 is a block diagram illustrating a device that includes circuitry for current measurement and ground fault detection, in accordance with example embodiments of this disclosure.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following:

A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system and method for current measurement and ground fault detection using current measurement coils. Older ovens only make use of a current measurement per power phase. In newer ovens, there is a desire to also implement ground fault detection systems/circuitry to detect current leaking. To do this, some ovens include a dedicated three-phase coil for ground fault detection. In such a configuration, all three power phases are fed through the three primary windings of a current measurement coil. The current trough the secondary winding will be the sum of the three primary currents divided by the winding ratio. When the system is functioning properly, the output equals zero. If there is an unbalance and the output is not equal to zero, this indicates the presence a current leak (also known as a ground fault). This method works but requires the addition of another set of coils or multi-phase coil assembly (e.g., three-phase coil) for ground fault detection, that is, in addition to the current measurement coils. To implement current measurement and ground fault detection functions with a reduced set of hardware, the embodiments described herein employ a common set of coils to measure phase currents and detect ground faults for a device that includes a multi-phase power system.

In embodiments, a plurality of (e.g., three) phase current measurement coils are placed in series so that the current/voltage across the phase current measurement coils is equivalent to a summation of their respective outputs. The sum of these outputs is then amplified to obtain a measurement of the summation of the detected phase currents. In order for this configuration to operate properly, the traditional output of the phase current measurement circuits with the rectifier in front of the resistor is replaced with a rectifier behind the sense resistor because, once rectified, the voltages added together will not be zero in a normal situation (without leakage current). In addition to functioning with less/smaller components, the current measurement and ground fault detection system/circuitry with the rectifier behind the sense resistor also has the advantage of having higher precision at current levels below 1 A. The offset created because the phase current measurement coils are placed in series must be removed to be able to read and handle three currents separately. This is accomplished by using three differential amplifiers, for example, by differential amplifiers in each of the phase current measurement circuits.

Some advantages of the disclosed current measurement and ground fault detection system/circuitry include the following. The current measurement and ground fault detection system/circuitry allows for implementation of ground fault detection without the need of a separate large, heavy, three-phase coil. Instead, the current measurement and ground fault detection system/circuitry makes use of existing phase current measurement coils, only adding some small, light and inexpensive components. The current measurement and ground fault detection system/circuitry also provides improved implementation of the current measurement circuits, with more linear behavior.

FIG. 1 is a block diagram illustrating a device 100 that may include a system/circuitry 200 for current measurement and ground fault detection, in accordance with example embodiments of this disclosure. In embodiments, the device 100 is coupled to a power supply 102 (e.g., a power supply unit (PSU), or the like) that is coupled to and/or part of a multi-phase system 104 (e.g., a three-phase power system). The multi-phase system 104 can be configured to power one or more of the device components 106. For example, the device 100 may comprise an aircraft galley insert including components, such as sensors, actuators, interface devices, controllers, heating/cooling elements, and the like. In an example embodiment, the device 100 is an oven with one or more heating elements (components 106) powered by the multi-phase system 104.

The current measurement and ground fault detection system/circuitry 200 may be coupled to a portion of the multi-phase system 104. For example, in some embodiments, the current measurement and ground fault detection system/circuitry 200 may be coupled to front-end portion of the multi-phase system 104 (e.g., to connectors or transmission lines of the power supply 102). In other embodiments, current measurement and ground fault detection system/circuitry 200 may be coupled to an output portion of the multi-phase system 104 (e.g., to connectors or transmission lines of a component 106 powered by the multi-phase system 104). The current measurement and ground fault detection system/circuitry 200 may be coupled to any portion of the multi-phase system 104. For example, in some embodiments, the current measurement and ground fault detection system/circuitry 200 may be coupled to an intermedial portion of the multi-phase system 104 (e.g., to connectors or transmission lines between the front-end portion and the output portion of the multi-phase system 104).

Figure 2:
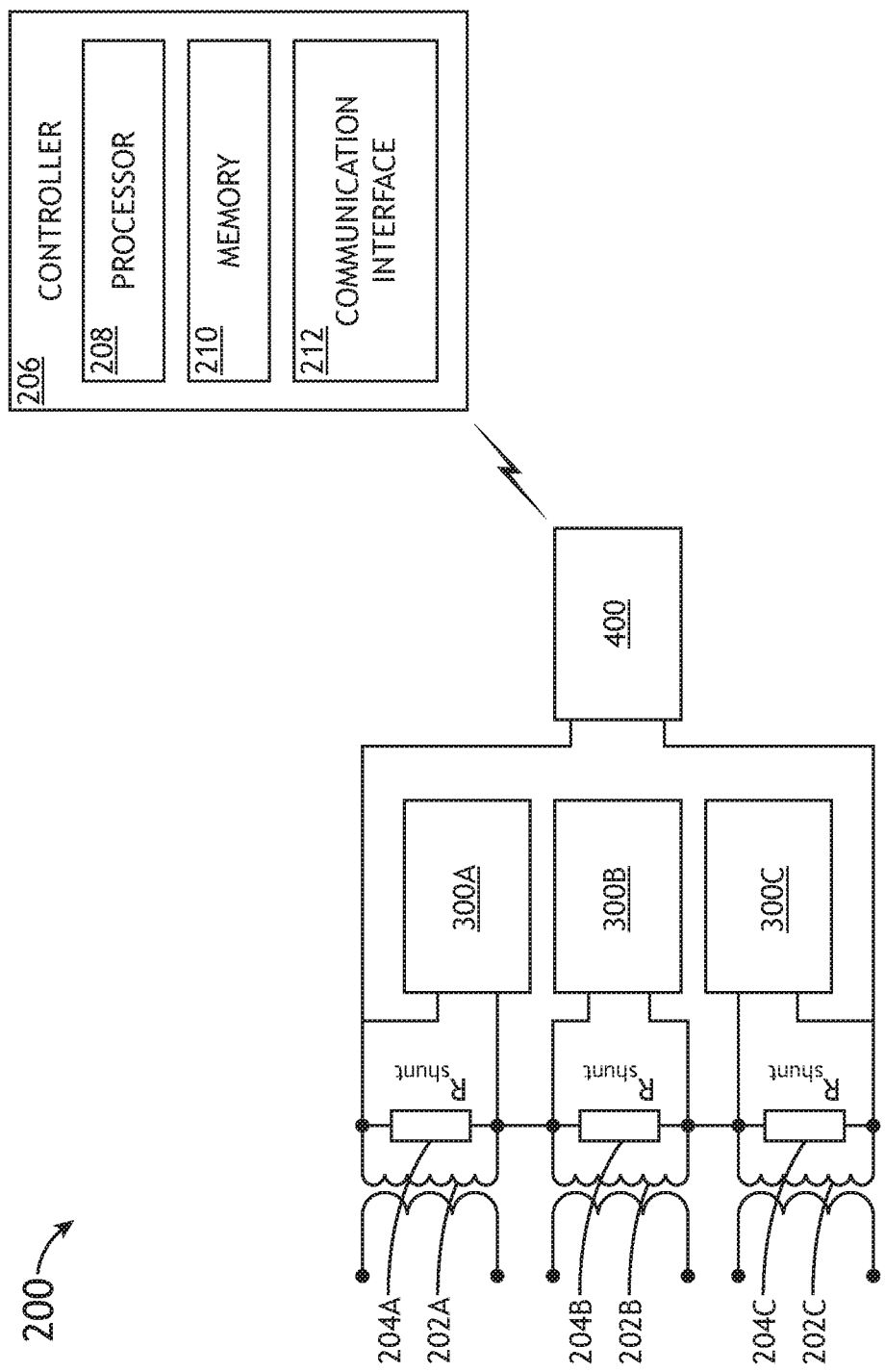
FIG. 2 is a schematic illustration of a system/circuitry for current measurement and ground fault detection, in accordance with example embodiments of this disclosure.

The current measurement and ground fault detection system/circuitry 200 is illustrated in FIG. 2, in accordance with example embodiments of this disclosure. In embodiments, the current measurement and ground fault detection system/circuitry 200 includes a plurality of phase current measurement coils 202 (e.g., coils 202A, 202B, 202C) configured to detect phase currents associated with at least one portion of the multi-phase system 104. For example, the phase current measurement coils 202 may be configured to detect currents of respective phases of the multi-phase system 104 (e.g., currents running through respective connectors or transmission lines at the portion of the multi-phase system 104 that the system/circuitry 200 is coupled to). The current measurement and ground fault detection system/circuitry 200 further includes a plurality of phase current measurement circuits 300 (e.g., phase current measurement circuitry 300A, 300B, and 300C) and a ground fault detection circuit 400 connected to the phase current measurement coils 202.

The phase current measurement circuits 300 are configured to measure the phase currents detected by the phase current measurement coils 202. For example, each of the phase current measurement coils 202 may be coupled to a respective phase current measurement circuit 300 configured to measure the phase current detected by that phase current measurement coil 202. In an example embodiment, phase current measurement circuits 300A, 300B, and 300C are coupled to and configured to measure the phase currents detected by phase current measurement coils 202A, 202B, and 202C, respectively. As shown in FIG. 2, each of the phase current measurement circuits 300 may be coupled a first end and a second end of the secondary coil of a respective one of the phase current measurement coils 202.

The ground fault detection circuit 400 is configured to measure a summation of the phase currents detected by the phase current measurement coils 202. For example, the ground fault detection circuit 400 can be configured to measure the summation of three phase currents detected by phase current measurement coils 202A, 202B, and 202C. In embodiments, the secondary side (i.e., secondary coils) of the phase current measurement coils 202 are connected in series with one another, and the ground fault detection circuit 400 is configured to measure the summation of the phase currents by detecting the current/voltage across the series-connected phase current measurement coils 202. As shown in FIG. 2, in an example embodiment, a first end of phase current measurement coil 202A is coupled to the ground fault detection circuit 400, a second end of phase current measurement coil 202A is coupled to a first end of phase current measurement coil 202B, a second end of phase current measurement coil 202B is coupled to a first end of phase current measurement coil 202C, and a second end of phase current measurement coil 202C is coupled to the ground fault detection circuit 400. In this configuration, the ground fault detection circuit 400 can measure a summation of the currents/voltages across phase current measurement coils 202A, 202B, and 202C by detecting the current/voltage between the first end of phase current measurement coil 202A and the second end of phase current measurement coil 202C.

In embodiments, the current measurement and ground fault detection system/circuitry 200 further includes a plurality of shunt resistors 204 (e.g., shunt resistors 204A, 204B, and 204C) coupled to respective phase current measurement coils 202. For example, each of the phase current measurement coils 202 may be connected in parallel with a respective shunt resistor 204. In an example embodiment, phase current measurement coil 202A is connected in parallel with shunt resistor 204A, phase current measurement coil 202B is connected in parallel with shunt resistor 204B, phase current measurement coil 202C is connected in parallel with shunt resistor 204C. In this configuration, the voltage drop across each shunt resistor 204 is associated with the current detected by the phase current measurement coil 202 that is coupled to the shunt resistor 204. For example, the voltage drop across shunt resistor 204A is associated with the current detected by phase current measurement coil 202A, the voltage drop across shunt resistor 204B is associated with the current detected by phase current measurement coil 202B, and the voltage drop across shunt resistor 204C is associated with the current detected by phase current measurement coil 202C.

Referring now to FIG. 3, each of the phase current measurement circuits 300 is configured to measure a phase current detected by a respective one of the phase current measurement coils 202 by detecting a voltage drop across the respective one of the shunt resistors 204 (sometimes referred to as the "sense" resistors). In embodiments, each of the phase current measurement circuits 300 includes a differential amplifier 302 configured to detect the voltage drop across the respective one of the shunt resistors 204. A positive consequence of this implementation is a more linear behavior of the circuit (as compared to old methods) due to the replacement of rectifying diodes by electronic rectification with an operational amplifier that creates a high impedance input and the location of the rectification placed behind the sense resistor that improves the linearity of the resistive load (Rshunt 204) visible for the current measurement coils 202 to reduce the measurement error in the current measurement and ground fault detection circuitry/system 200. In embodiments, each of the phase current measurement circuits 300 further includes an active rectifier 304 (e.g., based on operational amplifiers) and a low pass filter 306 in series with the differential amplifier 302. The signal from the differential amplifier 302 may be fed through the active rectifier 304 to obtain a DC signal which is then filtered by the low pass filter 306 to an average voltage level to condition the signal for input to a controller 206 (e.g., a microcontroller, microprocessor, or the like). In some embodiments, each of the phase current measurement circuits 300 further includes a buffer amplifier 308 configured to amplify an output (DC) signal from the low pass filter 306 before the output signal is fed into the controller 206. In general, the buffer amplifier 308 can be configured to adjust (e.g., amplify or attenuate) the output signal based on the application (e.g., for input to a controller, or for input to another circuit or system).

As indicated above, the ground fault detection circuit 400 can measure a summation of the currents/voltages across the series-connected phase current measurement coils 202A, 202B, and 202C by detecting the current/voltage between the first end of phase current measurement coil 202A and the second end of phase current measurement coil 202C. In embodiments, the shunt resistors 204 are also connected in series with one another, and the ground fault detection circuit 400 is configured to measure the summation of the phase currents by detecting a voltage drop across the shunt resistors 204. As shown in FIG. 4, the ground fault detection circuit 400 may include a differential amplifier 402 configured to detect the voltage drop across the phase current measurement coils 202 and/or their respective shunt resistors 204. The amplification level (e.g., gain or power level) of differential amplifier 402 of the ground fault detection circuit 400 may be higher than an amplification level of the differential amplifiers 302 of the current measurement circuits 300. In embodiments, the ground fault detection circuit 400 further includes an active rectifier 404 and a low pass filter 406 in series with the differential amplifier 402. The signal from the differential amplifier 402 may be fed through the active rectifier 404 to obtain a DC signal which is then filtered by the low pass filter 406 to an average voltage level to condition the signal for input to the controller 206. In some embodiments, the ground fault detection circuit 400 further includes a buffer amplifier 408 configured to amplify an output signal (e.g., the DC signal) from the low pass filter 406 before the output signal is fed into the controller 206. In general, the buffer amplifier 408 can be configured to adjust (e.g., amplify or attenuate) the output signal based on the application (e.g., for input to a controller, or for input to another circuit or system).

In some embodiments, the outputs of the phase current measurement circuits 300 and the ground fault detection circuit 400 are fed into the controller 206. The controller 206 can be configured to determine phase currents based on the outputs from the phase current measurement circuits 300. The controller 206 can also be configured to detect ground faults based on the output of the ground fault detection circuit 400. For example, the controller 206 may detect a ground fault when the output of the ground fault detection circuit 400 is a non-zero output or is indicative of a non-zero summation of currents detected by the phase current measurement coils 202.

As shown in FIG. 2, in some embodiments, the controller 206 may include at least one processor 208, memory 210, and a communication interface 212. The processor 208 provides processing functionality for at least the controller 206 and can include any number of processors, micro-controllers, circuitry, field programmable gate array (FPGA) or other processing systems, and resident or external memory for storing data, executable code, and other information accessed or generated by the controller 206. The processor 208 can execute one or more software programs embodied in a non-transitory computer readable medium (e.g., memory 210) that implement techniques described herein. The processor 208 is not limited by the materials from which it is formed, or the processing mechanisms employed therein and, as such, can be implemented via semiconductor(s) and/or transistors (e.g., using electronic integrated circuit (IC) components), and so forth.

The memory 210 can be an example of tangible, computer-readable storage medium that provides storage functionality to store various data and/or program code associated with operation of the controller 206/processor 208, such as software programs and/or code segments, or other data to instruct the processor 208, and possibly other components of the controller 206, to perform the functionality described herein. Thus, the memory 210 can store data, such as a program of instructions for operating the controller 206, including its components (e.g., processor 208, communication interface 212, etc.), and so forth. It should be noted that while a single memory 210 is described, a wide variety of types and combinations of memory (e.g., tangible, non-transitory memory) can be employed. The memory 210 can be integral with the processor 208, can comprise stand-alone memory, or can be a combination of both. Some examples of the memory 210 can include removable and non-removable memory components, such as random-access memory (RAM), read-only memory (ROM), flash memory (e.g., a secure digital (SD) memory card, a mini-SD memory card, and/or a micro-SD memory card), solid-state drive (SSD) memory, magnetic memory, optical memory, universal serial bus (USB) memory devices, hard disk memory, external memory, and so forth.

The communication interface 212 can be operatively configured to communicate with components of the controller 206. For example, the communication interface 212 can be configured to retrieve data from the processor 208 or other devices (e.g., phase current measurement circuits 300, ground fault detection circuit 400, etc.), transmit data for storage in the memory 210, retrieve data from storage in the memory 210, and so forth. The communication interface 212 can also be communicatively coupled with the processor 208 to facilitate data transfer between components of the controller 206 and the processor 208. It should be noted that while the communication interface 212 is described as a component of the controller 206, one or more components of the communication interface 212 can be implemented as external components communicatively coupled to the controller 206 via a wired and/or wireless connection. The controller 206 can also include and/or connect to one or more input/output (I/O) devices (e.g., human machine interface (HMI) devices) via the communication interface 212. In embodiments, the communication interface 212 may include a transmitter, receiver, transceiver, physical connection interface, or any combination thereof.

Figure 5:
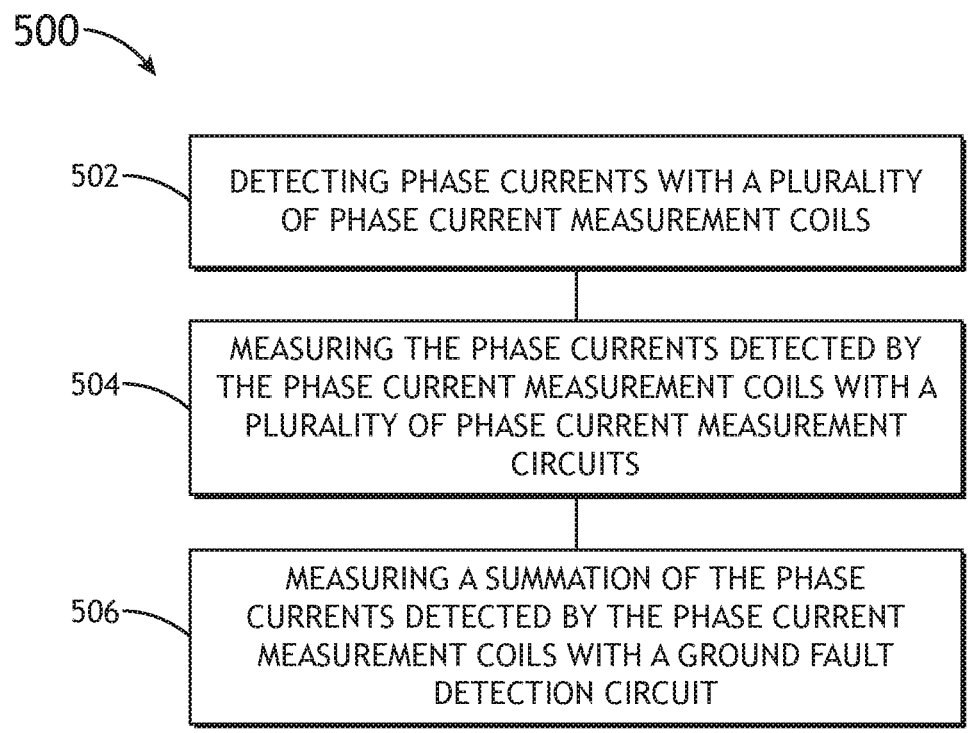
FIG. 5 is a flow diagram illustrating an example implementation of a method of current measurement and ground fault detection.

FIG. 5 illustrates an example implementation of a method 500 that employs the current measurement and ground fault detection system/circuitry 200 described herein. In general, operations of disclosed processes (e.g., method 500) may be performed in an arbitrary order, unless otherwise provided in the claims.

At step 502, the method 500 includes detecting phase currents with a plurality of phase current measurement coils 202. For example, the phase current measurement coils 202 may be configured to detect currents of respective phases of a multi-phase system 104 (e.g., currents running through respective connectors or transmission lines at a portion of the multi-phase system 104 that the phase current measurement coils 202 are coupled to).

At step 504, the method 500 includes measuring the phase currents detected by the phase current measurement coils 202 with a plurality of phase current measurement circuits 300. In some implementations, the phase current measurement circuits 300 may output current measurement signals to a controller 206. The controller 206 may determine phase current measurements based on the current measurement signals from the phase current measurement circuits 300.

At step 506, the method 500 includes measuring a summation of the phase currents detected by the phase current measurement coils 202 with a ground fault detection circuit 400. In implementations, a ground fault may be detected when the summation of the phase currents is a non-zero value (indicating the presence of a leakage current). For example, the ground fault detection circuit 400 may output a signal associated with a detected voltage drop or current across all the phase current measurement coils 202 to the controller 206. The controller 206 may detect a ground fault when the output of the ground fault detection circuit 400 is a non-zero output or is indicative of a non-zero summation of currents detected by the phase current measurement coils 202.

The method 500 may further include any step or operation implied or required by the embodiments of the current measurement and ground fault detection system/circuitry 200 described herein. The current measurement and ground fault detection system/circuitry 200 can also include any additional component or functionality expressed or implied by the method 500.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to achieve the objectives and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A system for current measurement and ground fault detection, comprising:
   a plurality of phase current measurement coils configured to detect phase currents associated with at least one portion of a multi-phase system;
   a plurality of shunt resistors, wherein each of the phase current measurement coils is connected in parallel with a respective one of the shunt resistors;
   a plurality of phase current measurement circuits connected to the phase current measurement coils and configured to measure the phase currents detected by the phase current measurement coils, wherein each of the phase current measurement circuits is configured to measure a phase current detected by a respective one of the phase current measurement coils by detecting a voltage drop across the respective one of the shunt resistors, wherein each of the phase current measurement circuits includes:
      a differential amplifier configured to detect the voltage drop across the respective one of the shunt resistors; and
      an active rectifier and a low pass filter in series with the differential amplifier; and
   a ground fault detection circuit connected to the phase current measurement coils and configured to measure a summation of the phase currents detected by the phase current measurement coils, wherein the shunt resistors are connected in series with one another, and the ground fault detection circuit is configured to measure the summation of the phase currents by detecting a voltage drop across the shunt resistors.

2. The system of claim 1, wherein the multi-phase system is a three-phase system.

3. The system of claim 1, wherein each of the phase current measurement circuits further includes a buffer amplifier configured to amplify an output signal from the low pass filter before the output signal is fed into a controller.

4. The system of claim 1, wherein the ground fault detection circuit includes:
   a differential amplifier configured to detect the voltage drop across the shunt resistors; and
   an active rectifier and a low pass filter in series with the differential amplifier.

5. The system of claim 4, wherein the ground fault detection circuit further includes a buffer amplifier configured to amplify an output signal from the low pass filter before the output signal is fed into a controller.

6. A device, comprising:
   one or more components;
   a multi-phase system configured to furnish electrical power to the one or more components;
   a plurality of phase current measurement coils configured to detect phase currents associated with at least one portion of the multi-phase system;
   a plurality of shunt resistors, wherein each of the phase current measurement coils is connected in parallel with a respective one of the shunt resistors;
   a plurality of phase current measurement circuits connected to the phase current measurement coils and configured to measure the phase currents detected by the phase current measurement coils, wherein each of the phase current measurement circuits is configured to measure a phase current detected by a respective one of the phase current measurement coils by detecting a voltage drop across the respective one of the shunt resistors, wherein each of the phase current measurement circuits includes:
      a differential amplifier configured to detect the voltage drop across the respective one of the shunt resistors; and
      an active rectifier and a low pass filter in series with the differential amplifier; and
   a ground fault detection circuit connected to the phase current measurement coils and configured to measure a summation of the phase currents detected by the phase current measurement coils.

7. The device of claim 6, wherein the multi-phase system is a three-phase system.

8. The device of claim 6, wherein each of the phase current measurement circuits further includes a buffer amplifier configured to amplify an output signal from the low pass filter before the output signal is fed into a controller.

9. The device of claim 6, wherein the ground fault detection circuit includes:
   a differential amplifier configured to detect the voltage drop across the shunt resistors; and
   an active rectifier and a low pass filter in series with the differential amplifier.

10. The device of claim 9, wherein the ground fault detection circuit further includes a buffer amplifier configured to amplify an output signal from the low pass filter before the output signal is fed into a controller.

11. The device of claim 6, wherein the device is an oven, and the one or more components comprise one or more heating elements.

* * * * *